(12) United States Patent
Noguchi

(10) Patent No.: US 12,131,767 B2
(45) Date of Patent: Oct. 29, 2024

(54) APPARATUSES AND METHODS FOR GENERATING REFRESH ADDRESSES

(71) Applicant: MICRON TECHNOLOGY, INC., Boise, ID (US)

(72) Inventor: Hidekazu Noguchi, Tokyo (JP)

(73) Assignee: Micron Technology, Inc., Boise, ID (US)

(*) Notice: Subject to any disclaimer, the term of this patent is extended or adjusted under 35 U.S.C. 154(b) by 268 days.

(21) Appl. No.: 17/929,981

(22) Filed: Sep. 6, 2022

(65) Prior Publication Data
US 2023/0005525 A1    Jan. 5, 2023

Related U.S. Application Data

(62) Division of application No. 17/093,334, filed on Nov. 9, 2020, now Pat. No. 11,468,937.

(51) Int. Cl.
*G11C 11/406* (2006.01)
(52) U.S. Cl.
CPC ............................. *G11C 11/40611* (2013.01)
(58) Field of Classification Search
CPC .............................................. G11C 11/40611

USPC .................................................... 365/149
See application file for complete search history.

(56) References Cited

U.S. PATENT DOCUMENTS

| | | |
|---|---|---|
| 2017/0287547 A1 | 10/2017 | Ito et al. |
| 2018/0342282 A1 | 11/2018 | Morgan |
| 2019/0066759 A1* | 2/2019 | Nale ................ G11C 11/40618 |
| 2019/0228815 A1* | 7/2019 | Morohashi .......... G11C 16/349 |
| 2022/0148646 A1 | 5/2022 | Noguchi |

OTHER PUBLICATIONS

U.S. Appl. No. 17/093,334 titled "Apparatuses and Methods for Generating Refresh Addresses" filed Nov. 9, 2020, pp. all pages of application as filed.

* cited by examiner

*Primary Examiner* — Anthan Tran
(74) *Attorney, Agent, or Firm* — Dorsey & Whitney LLP

(57) ABSTRACT

Apparatuses and methods for calculating targeted refresh addresses may include circuitry that may be used to calculate victim row addresses having a variety of spatial relationships to an aggressor row. The spatial relationship of the victim row addresses calculated by the circuitry may be based, at least in part, on states of control signals provided to the circuitry. That is, the circuitry may be used to calculate the different victim row addresses by changing the states of the control signals.

20 Claims, 9 Drawing Sheets

APPARATUSES AND METHODS FOR GENERATING REFRESH ADDRESSES

CROSS REFERENCE TO RELATED APPLICATION(S)

This application is a divisional of pending U.S. patent application Ser. No. 17/093,334 filed Nov. 9, 2020. The aforementioned application is incorporated herein by reference, it its entirety, for any purpose.

BACKGROUND

Information may be stored on individual memory cells of the memory as a physical signal (e.g., a charge on a capacitive element). The memory may be a volatile memory, and the physical signal may decay over time (which may degrade or destroy the information stored in the memory cells). It may be necessary to periodically refresh the information in the memory cells by, for example, rewriting the information to restore the physical signal to an initial value.

As memory components have decreased in size, the density of memory cells has greatly increased. An auto refresh operation may be carried out where a sequence of memory cells are periodically refreshed. Repeated access to a particular memory cell or group of memory cells (often referred to as a 'row hammer') may cause an increased rate of data degradation in nearby memory cells. It may be desirable to identify and refresh memory cells affected by the row hammer in a targeted refresh operation in addition to the auto refresh operation.

BRIEF DESCRIPTION OF THE DRAWINGS

FIG. 8 is a table illustrating logic states of control signals for indicating a spatial relationship between an aggressor row and victim rows according to an embodiment of the present disclosure.

FIG. 9 is a table illustrating logic states of flip and carry signals for generating targeted refresh addresses from match addresses according to an embodiment of the present disclosure.

DETAILED DESCRIPTION

Figure 1:
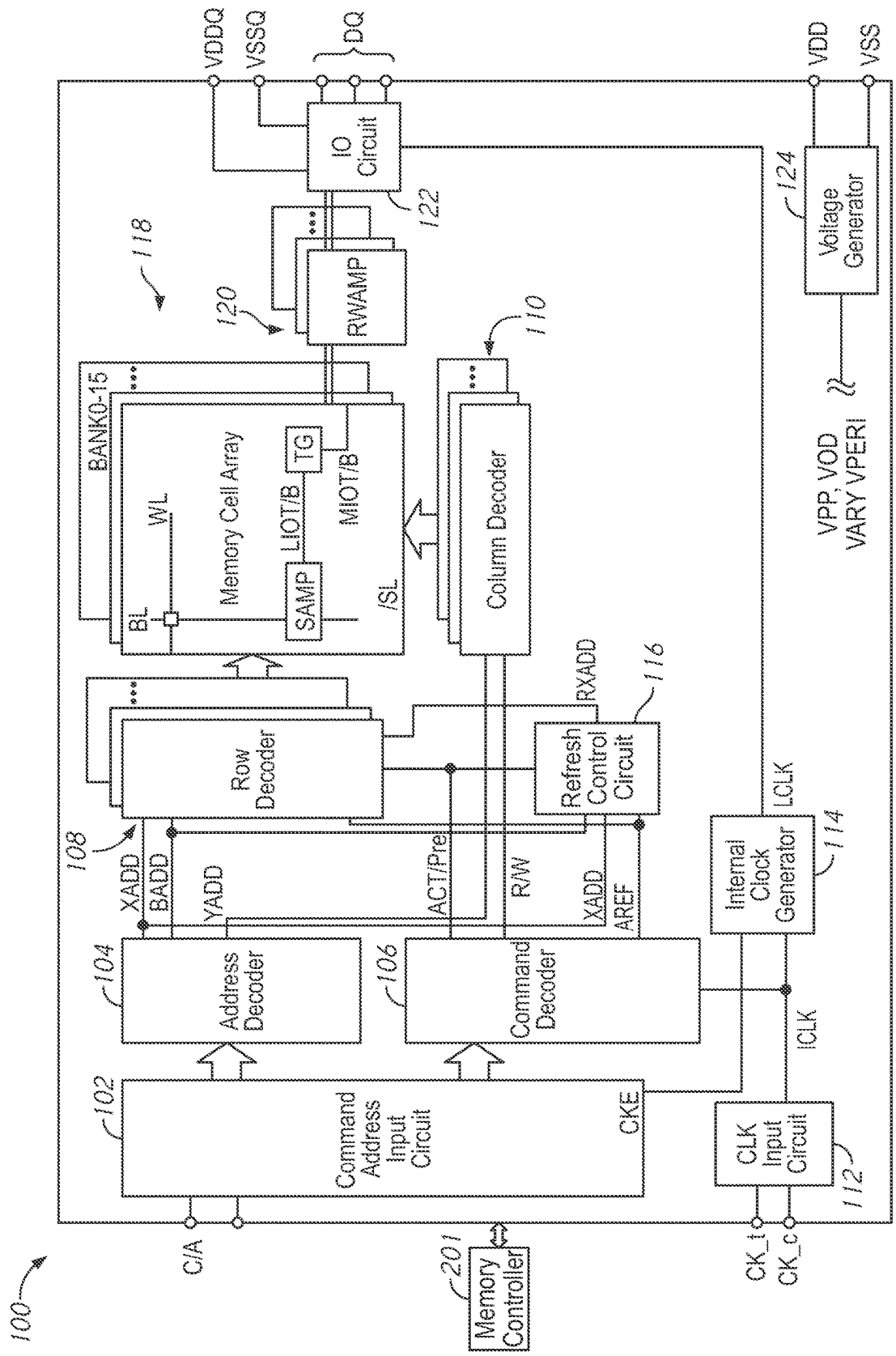
FIG. 1 is a block diagram of a semiconductor device according to an embodiment of the present disclosure.

The following description of certain embodiments is merely exemplary in nature and is in no way intended to limit the scope of the disclosure or its applications or uses. In the following detailed description of embodiments of the present systems and methods, reference is made to the accompanying drawings which form a part hereof, and which are shown by way of illustration specific embodiments in which the described systems and methods may be practiced. These embodiments are described in sufficient detail to enable those skilled in the art to practice presently disclosed systems and methods, and it is to be understood that other embodiments may be utilized and that structural and logical changes may be made without departing from the spirit and scope of the disclosure. Moreover, for the purpose of clarity, detailed descriptions of certain features will not be discussed when they would be apparent to those with skill in the art so as not to obscure the description of embodiments of the disclosure. The following detailed description is therefore not to be taken in a limiting sense, and the scope of the disclosure is defined only by the appended claims.

Information in a volatile memory device may be stored in memory cells (e.g., as a charge on a capacitive element), and may decay over time. The memory cells may be organized into rows (word lines) and columns (bit lines). In order to prevent information from being lost or corrupted due to this decay, the memory may carry out refresh operations. During a refresh operation, information may be rewritten to memory cells of word line to restore its initial state. The memory cells may be refreshed on a row-by-row (word line-by-word line basis). Auto refresh operations may be performed on the word lines of the memory in a sequence such that over time each of the word lines of the memory are refreshed at a rate faster than the expected rate of data degradation.

Repeated access to a particular row of memory (e.g., an aggressor row) may cause an increased rate of decay in rows (e.g., victim rows) which are close to the aggressor row. These repeated accesses may be part of a deliberate attack against the memory and/or may be due to 'natural' access patterns of the memory. The increased rate of decay in the victim rows may require that they may be refreshed as part of a targeted refresh operation. The victim rows may be rows directly adjacent to the aggressor row (+/−1) or more distant, for example, adjacent to the rows directly adjacent to the aggressor row (+/−2).

Once an aggressor row has been identified, the row address for each victim row is determined. The victim row addresses for the victim rows may then be used to perform a refresh operation on the victim rows. Due to space limitations, layout restrictions, and other factors in the memory, the physical row address may not correspond to the logical row address, sometimes referred to as address scrambling. Accordingly, when an aggressor row is identified, conversions (e.g., scrambling) between the physical addresses of the rows and the logical addresses of the rows is performed to determine the row addresses of the neighboring victim rows. This may require complex circuitry including counters with latches or other components that require significant layout space. Additionally or alternatively, it may require time-consuming scrambling operations, such as comparing physical and/or logical addresses to look-up tables.

U.S. Pat. No. 10,580,475, which is incorporated herein by reference for any purpose, describes techniques for calculating victim row addresses for victim rows directly adjacent (+/−1) to an aggressor row. However, as memory cell sizes and physical spaces between rows continue to be reduced in memory arrays, if a row hammer attack occurs, more distant rows (e.g., +/−2, +/−3, +/−4, +/−8) from the aggressor rows may become victim rows. Thus, additional rows may need to be refreshed during targeted refresh operations. Accordingly, techniques for calculating row addresses for more distant victim rows may be desirable.

The present disclosure is drawn to apparatuses, systems, and methods for calculating victim row addresses for victim rows having a variety of spatial relationships to an aggressor row. The spatial relationship of the victim row to the aggressor row for which the victim row address is calculated may be based, at least in part, on one or more control signals. In some embodiments, the same circuitry may be used to calculate the different victim row addresses by changing the states of the control signals. The apparatuses and methods disclosed herein may reduce or eliminate the need for scrambling circuits with latches and/or other complex circuitry that may require more layout area. The apparatuses and methods disclosed herein may reduce or eliminate the need for lookup tables and/or other scrambling operations that may require more computation time.

FIG. 1 is a block diagram of a semiconductor device according an embodiment of the disclosure. The semiconductor device 100 may be a semiconductor memory device, such as a DRAM device integrated on a single semiconductor chip.

The semiconductor device 100 includes a memory array 118. The memory array 118 is shown as including a plurality of memory banks. In the embodiment of FIG. 1, the memory array 118 is shown as including sixteen memory banks BANK0-BANK 15. More or fewer banks may be included in the memory array 118 of other embodiments. Each memory bank includes a plurality of word lines WL, a plurality of bit lines BL and/BL, and a plurality of memory cells MC arranged at intersections of the plurality of word lines WL and the plurality of bit lines BL and/BL. The selection of the word line WL is performed by a row decoder circuit 108 and the selection of the bit lines BL and/BL is performed by a column decoder circuit 110. In the embodiment of FIG. 1, the row decoder circuit 108 includes a respective row decoder circuit for each memory bank and the column decoder circuit 110 includes a respective column decoder for each memory bank. The bit lines BL and/BL are coupled to a respective sense amplifier (SAMP). Read data from the bit line BL or/BL is amplified by the sense amplifier SAMP, and transferred to read/write amplifiers 120 over complementary local data lines (LIOT/B), transfer gate (TG), and complementary main data lines (MIOT/B). Conversely, write data outputted from the read/write amplifiers 120 is transferred to the sense amplifier SAMP over the complementary main data lines MIOT/B, the transfer gate TG, and the complementary local data lines LIOT/B, and written in the memory cell MC coupled to the bit line BL or/BL.

The semiconductor device 100 may employ a plurality of external terminals that include command and address (C/A) terminals coupled to a command and address bus to receive commands and addresses, and a CS signal, clock terminals to receive clocks CK_t and CK_c, data terminals DQ to provide data, and power supply terminals to receive power supply potentials VDD, VSS, VDDQ, and VSSQ.

The clock terminals are supplied with external clocks CK_t and CK_c that are provided to an input circuit 112. The external clocks may be complementary. The input circuit 112 generates an internal clock ICLK based on the CK_t and CK_c clocks. The ICLK clock is provided to the command decoder circuit 110 and to an internal clock generator 114. The internal clock generator 114 provides various internal clocks LCLK based on the ICLK clock. The LCLK clocks may be used for timing operation of various internal circuits. The internal data clocks LCLK are provided to the input/output circuit 122 to time operation of circuits included in the input/output circuit 122, for example, to data receivers to time the receipt of write data.

The C/A terminals may be supplied with memory addresses. The memory addresses supplied to the C/A terminals are transferred, via a command/address input circuit 102, to an address decoder 104. The address decoder 104 receives the address and supplies a decoded row address XADD to the row decoder circuit 108 and supplies a decoded column address YADD to the column decoder circuit 110. The address decoder 104 may also supply a decoded bank address BADD, which may indicate the bank of the memory array 118 containing the decoded row address XADD and column address YADD. The C/A terminals may be supplied with commands. Examples of commands include access commands for accessing the memory, such as commands for performing read operations and commands for performing write operations. The access commands may be associated with one or more of a row address XADD, column address YADD, and/or bank address BADD to indicate the memory cell(s) to be accessed. In some embodiments, the commands and/or addresses may be provided by a component external to the device 100, for example, as shown in FIG. 1, a memory controller 101 in communication with the device 100.

The commands may be provided as internal command signals to a command decoder circuit 106 via the command/address input circuit 102. The command decoder circuit 106 includes circuits to decode the internal command signals to generate various internal signals and commands for performing operations. For example, the command decoder circuit 106 may provide a row command signal to select a word line and a column command signal to select a bit line.

The device 100 may receive access commands for performing read operations. When the commands are received, and a bank address, a row address and a column address are timely supplied with the commands, read data is read from memory cells in the memory array 118 corresponding to the row address and column address. The commands are received by the command decoder circuit 106, which provides internal commands so that read data from the memory array 118 is provided to the read/write amplifiers 120. The read data is output to outside from the data terminals DQ via the input/output circuit 122.

The device 100 may receive access commands for performing write operations. When the commands are received, and a bank address, a row address and a column address are timely supplied with the commands, write data supplied to the data terminals DQ is written to a memory cells in the memory array 118 corresponding to the row address and column address. The commands are received by the command decoder circuit 106, which provides internal commands so that the write data is received by data receivers in the input/output circuit 122. Write clocks may also be provided to the external clock terminals for timing the receipt of the write data by the data receivers of the input/output circuit 122. The write data is supplied via the input/output circuit 122 to the read/write amplifiers 120, and by the read/write amplifiers 120 to the memory array 118 to be written into the memory cell MC.

The device 100 may also receive commands causing it to carry out one or more refresh operations as part of a self-refresh mode. The device 100 may be periodically placed in a refresh mode. Thus, refresh operations may be performed periodically each time the memory device is in the refresh mode. In some embodiments, the refresh mode command may be externally issued to the memory device 100. In some embodiments, the refresh mode command may be periodically generated by a component of the device. In some embodiments, when an external signal indicates a refresh mode entry command (e.g., an external refresh command), the refresh signal AREF may also be activated. The refresh signal AREF may be a pulse signal which is activated when the command decoder circuit 106 receives a signal which indicates entry to the self-refresh mode. The refresh signal AREF may be activated once immediately after command input, and thereafter may be cyclically activated at desired internal timing. In some embodiments, the refresh signal AREF may cause more than one refresh operation to be performed, which may be referred to as a "multi pump" refresh. In some embodiments, the refresh signal AREF may be active during the refresh mode. In some embodiments, the refresh signal AREF may be active during the multiple refresh operations. The refresh signal AREF may be used to control the timing of refresh operations during the refresh mode. A self-refresh exit command may cause the automatic activation of the refresh signal AREF to stop and may cause the device 100 to return to an idle state and/or resume other operations.

As used herein, an activation of a signal may refer to any portion of a signal's waveform to which that a circuit responds. For example, if a circuit responds to a rising edge, then a signal switching from a low level to a high level may be an activation. One example type of activation is a pulse, where a signal switches from a low level to a high level for a period of time, and then back to the low level. This may trigger circuits which respond to rising edges, falling edges, and/or signals being at a high logical level.

The refresh signal AREF is supplied to the refresh control circuit 116. The refresh control circuit 116 supplies a refresh row address RXADD to the row decoder circuit 108, which may refresh one or more word lines WL indicated by the refresh row address RXADD. In some embodiments, the refresh address RXADD may represent a single word line. In some embodiments, the refresh address RXADD may represent multiple word lines, which may be refreshed sequentially or simultaneously by the row decoder circuit 108. In some embodiments, the number of word lines represented by the refresh address RXADD may vary from one refresh address to another. The refresh control circuit 116 may control a timing of the refresh operation, and may generate and provide the refresh address RXADD. The refresh control circuit 116 may be controlled to change details of the refreshing address RXADD (e.g., how the refresh address is calculated, the timing of the refresh addresses, the number of word lines represented by the address), for example, by control signals provided by command decoder circuit 106, or may operate based on internal logic.

The refresh control circuit 116 may selectively output a targeted refresh address (e.g., which specifies one or more victim address based on an aggressor) or an automatic refresh address (e.g., from a sequence of auto refresh addresses) as the refresh address RXADD. Based on the type of refresh address RXADD, the row decoder circuit 108 may perform a targeted refresh or auto refresh operation. The automatic refresh addresses may be from a sequence of addresses which are provided based on activations of the refresh signal AREF and/or pumps generated responsive to AREF. The refresh control circuit 116 may cycle through the sequence of auto refresh addresses at a rate determined by AREF. In some embodiments, the auto refresh operations may generally occur with a timing such that the sequence of auto refresh addresses is cycled such that no information is expected to degrade in the time between auto refresh operations for a given word line. In other words, auto refresh operations may be performed such that each word line is refreshed at a rate faster than the expected rate of information decay.

The refresh control circuit 116 may also determine targeted refresh addresses which are addresses that require refreshing (e.g., victim addresses corresponding to victim rows) based on the access pattern of nearby addresses (e.g., aggressor addresses corresponding to aggressor rows) in the memory array 118. The refresh control circuit 116 may use one or more signals of the device 100 to calculate the targeted refresh address. For example, the refresh address RXADD may be a calculated based on the row addresses XADD provided by the address decoder 104.

According to embodiments of the present disclosure, the refresh control circuit 116 may calculate one or more victim addresses. The victim addresses may correspond to victim rows have varying spatial relationships to the aggressor row. For example, the victim addresses may correspond to victim rows directly adjacent to the aggressor row (+/−1) or victim rows more spatially distant from the aggressor row (e.g., +/−2, +/−3, +/−4, etc.). Which victim row addresses are calculated for the aggressor row may be based, at least in part, on the state of one or more control signals. The control signals may be generated internally by the refresh control circuit 116 or another component of device 100 (e.g., command decoder circuit 106), and/or externally (e.g., memory controller 101). In some embodiments, the circuitry used to calculate the victim addresses for the victim rows may be the same for all of the victim rows, regardless of the spatial relationship of the victim rows. In some embodiments, the states of the one or more control signals may determine the spatial relationship of the victim rows for which the victim row addresses are calculated. For example, the control signals may have one or more states to calculate the +/−2 victim row addresses and another one or more states to calculate the +/−4 victim row addresses. The calculated victim row addresses may be used as targeted refresh addresses provided as RXADD during targeted refresh operations. In some applications, using same circuitry for calculating all of the victim row addresses may reduce the layout space necessary for the address calculation circuitry.

In some embodiments, the refresh control circuit 116 may sample the current value of the row address XADD provided by the address decoder 104 along a row address bus, and determine a targeted refresh address based on one or more of the sampled addresses. The sampled addresses may be stored in a data storage unit of the refresh control circuit. When a row address XADD is sampled, it may be compared to the stored addresses in the data storage unit. In some embodiments, the aggressor address may be determined based on the sampled and/or stored addresses. For example, the comparison between the sampled address and the stored addresses may be used to update a count value (e.g., an access count) associated with the stored addresses and the aggressor address may be calculated based on the count values. The refresh addresses RXADD may then be used based on the aggressor addresses. In other embodiments, other techniques for determining the aggressor addresses.

While in general the present disclosure refers to determining aggressor and victim word lines and addresses, it should be understood that as used herein, an aggressor word line does not necessarily need to cause data degradation in neighboring word lines, and a victim word line does not necessarily need to be subject to such degradation. The refresh control circuit 116 may use some criteria to judge whether an address is an aggressor address, which may capture potential aggressor addresses rather than definitively determining which addresses are causing data degradation in nearby victims. For example, the refresh control circuit 116 may determine potential aggressor addresses based on a pattern of accesses to the addresses and this criteria may include some addresses which are not aggressors, and miss some addresses which are. Similar victim addresses may be determined based on which word lines are expected to be effected by aggressors, rather than a definitive determination of which word lines are undergoing an increased rate of data decay.

The refresh address RXADD may be provided with a timing based on a timing of the refresh signal AREF. During the periodic refresh operations of a refresh mode, the refresh control circuit 116 may have time slots corresponding to the timing of AREF, and may provide one or more refresh addresses RXADD during each time slot. In some embodiments, the targeted refresh address may be issued in (e.g., "steal") a time slot which would otherwise have been assigned to an auto refresh address. In some embodiments, certain time slots may be reserved for targeted refresh addresses, and the refresh control circuit 116 may determine whether to provide a targeted refresh address, not provide an address during that time slot, or provide an auto refresh address instead during the time slot.

The refresh control circuit 116 may use multiple methods to determine the timing of targeted refresh operations. The refresh control circuit 116 may have periodic targeted refresh operations during a refresh mode, where the refresh control circuit 216 performs auto refresh operations and targeted refresh operations (e.g., by providing a targeted refresh address as the refresh address RXADD) based on a periodic schedule. For example, after entering a refresh mode, the refresh control circuit 116 may perform a certain number of auto refresh operations, and then perform (e.g., steal) a certain number of targeted refresh operations. For multi pump refresh operations, each time the active refresh signal AREF is received, the refresh control circuit 116 may perform M different refresh operations, by providing M different refresh addresses RXADD. The refresh control circuit 116 may have a fixed pattern where some pumps are assigned to auto refresh operation and some pumps are assigned to targeted refresh operations.

The power supply terminals are supplied with power supply potentials VDD and VSS. The power supply potentials VDD and VSS are supplied to an internal voltage generator circuit 124. The internal voltage generator circuit 124 generates various internal potentials VPP, VOD, VARY, VPERI, and the like based on the power supply potentials VDD and VSS supplied to the power supply terminals. The internal potential VPP is mainly used in the row decoder circuit 108, the internal potentials VOD and VARY are mainly used in the sense amplifiers SAMP included in the memory array 118, and the internal potential VPERI is used in many peripheral circuit blocks.

The power supply terminals are also supplied with power supply potentials VDDQ and VSSQ. The power supply potentials VDDQ and VSSQ are supplied to the input/output circuit 122. The power supply potentials VDDQ and VSSQ supplied to the power supply terminals may be the same potentials as the power supply potentials VDD and VSS supplied to the power supply terminals in an embodiment of the disclosure. The power supply potentials VDDQ and VSSQ supplied to the power supply terminals may be different potentials from the power supply potentials VDD and VSS supplied to the power supply terminals in another embodiment of the disclosure. The power supply potentials VDDQ and VSSQ supplied to the power supply terminals are used for the input/output circuit 122 so that power supply noise generated by the input/output circuit 122 does not propagate to the other circuit blocks.

Figure 2:
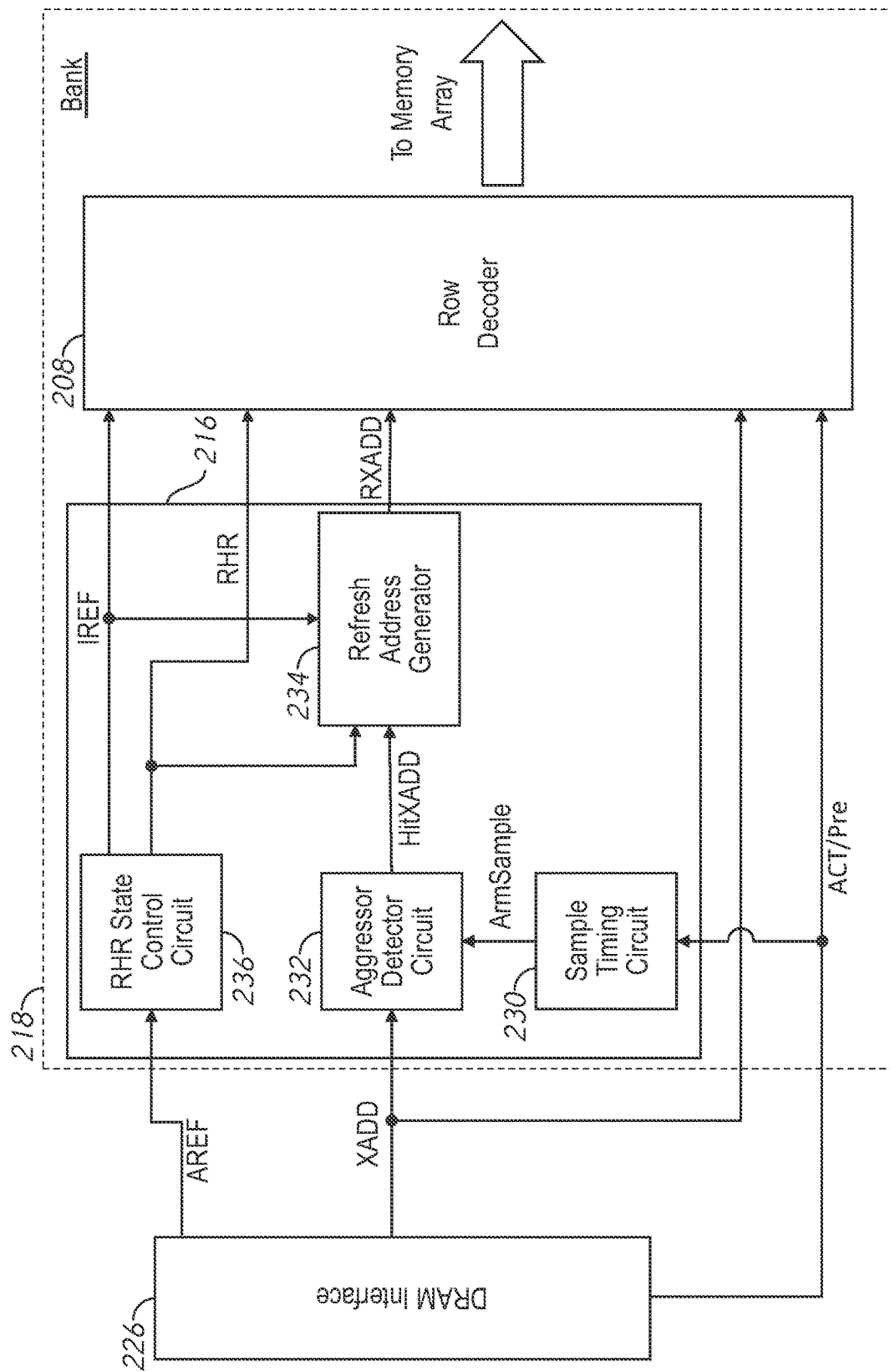
FIG. 2 is a block diagram of a refresh control circuit according to an embodiment of the present disclosure.

FIG. 2 is a block diagram of a refresh control circuit according to an embodiment of the present disclosure. The refresh control circuit 216 may, in some embodiments, be included in the refresh control circuit 116 of FIG. 1. Certain internal components and signals of the refresh control circuit 216 are shown to illustrate the operation of the refresh control circuit 216. The dotted line 218 is shown to represent that in certain embodiments, each of the components (e.g., the refresh control circuit 216 and row decoder 208) may correspond to a particular bank of memory, and that these components may be repeated for each of the banks of memory. Thus, there may be multiple refresh control circuits 216 and row decoders 208. For the sake of brevity, only components for a single bank will be described.

The DRAM interface 226 may represent one or more components which provides signals to components of the bank. In some embodiments, the DRAM interface 226 may represent a memory controller (e.g., memory controller 101) coupled to the semiconductor memory device (e.g., device 100 of FIG. 1). In some embodiments, the DRAM interface 226 may represent components such as the command address input circuit 102, the address decoder 104, and/or the command decoder 106 of FIG. 1. The DRAM interface 226 may provide a row address XADD, the refresh signal AREF, and access signals such as an activation signal ACT and a pre-charge signal Pre. The refresh signal AREF may be a periodic signal which may indicate when an auto refresh operation is to occur. The access signals ACT and Pre may generally be provided as part of an access operation along with a row address XADD. The activation signal ACT may be provided to activate a given bank of the memory. The pre-charge signal Pre may be provided to pre-charge the given bank of the memory. The row address XADD may be a signal including multiple bits (which may be transmitted in series or in parallel) and may correspond to a specific row of an activated memory bank.

The refresh control circuit 216 may include a sample timing circuit 230, an aggressor detector circuit 232, a row hammer refresh (RHR) state control circuit 236 and a refresh address generator 234. The refresh control circuit 216 provides refresh address RXADD with timing based on the refresh signal AREF, wherein some of the refresh addresses are based on the received row address XADD.

The aggressor detector circuit 232 may sample the current row address XADD responsive to an activation a sampling signal ArmSample. In some embodiments, the sampled addresses may be stored in the aggressor circuit 232 and/or compared to previously stored addresses. The aggressor detector circuit 232 may provide a match address HitXADD based on a currently sampled row address XADD and/or previously sampled row addresses. The RHR state control circuit 236 may provide the signal RHR to indicate that a row hammer refresh (e.g., a refresh of the victim rows corresponding to an identified aggressor row) should occur. The RHR state control circuit 236 may also provide an internal refresh signal IREF, to indicate that an auto refresh should occur. Responsive to an activation of RHR or IREF, the refresh address generator 234 may provide a refresh address RXADD, which may be an auto refresh address or may be one or more victim addresses corresponding to victim rows of the aggressor row corresponding to the match address HitXADD. The row decoder 208 may perform a refresh operation responsive to the refresh address RXADD and the row hammer refresh signal RHR. The row decoder 208 may perform an auto refresh operation based on the refresh address RXADD and the internal refresh signal IREF. In some embodiments, the row decoder 208 may be included in row decoder circuit 108.

In embodiments where row accesses are monitored by sampling (in contrast to monitoring every access operation) the sample timing circuit 230 provides the sample arming signal ArmSample. The signal ArmSample may be a binary signal which can be at a high logical level (which may be represented by a first voltage, such as VDD) or at a low logical level (which may be represented by a second voltage, such as ground or VSS). An activation of ArmSample may be a 'pulse', where ArmSample is raised to a high logic level and then returns to a low logic level. In some embodiments, the sample timing circuit 230 may use one or more mechanisms to regularly (e.g., non-random), randomly, semi-randomly, or pseudo-randomly determine whether to provide an activation of the signal ArmSample. In some embodiments, the sample timing circuit 230 may receive the access signals ACT and Pre. In some embodiments, activations of the signal ArmSample may further be based on the signals ACT and Pre to ensure that each activation of the signal ArmSample is associated with an access operation.

The aggressor detector circuit 232 may receive the row address XADD from the DRAM interface 226 and the signal ArmSample from the sample timing circuit 230. The row address XADD on the row address bus may change as the DRAM interface 226 directs access operations (e.g., read and write operations) to different rows of the memory cell array (e.g., memory cell array 118 of FIG. 1). Each time the aggressor detector circuit 232 receives an activation (e.g., a pulse) of the signal ArmSample, the aggressor detector circuit 232 may sample the current value of XADD. In some embodiments, the aggressor detector circuit 232 may provide the currently sampled value of XADD as the match address HitXADD.

In some embodiments, responsive to an activation of the signal ArmSample, the aggressor detector circuit 232 may determine if one or more rows is an aggressor row based on the sampled row address XADD, and may provide identified aggressor rows as the match address HitXADD. As part of this determination, the aggressor detector circuit 232 may record (e.g., by latching in a register and/or otherwise storing) the current value of XADD responsive to the activation of ArmSample. The current value of XADD may be compared to previously recorded addresses in the aggressor detector circuit 232 (e.g., the addresses stored in the latch/register), to determine access patterns overtime of the sampled addresses. If the aggressor detector circuit 232 determines that an address (which, in some embodiments, may be either the current address or a previously stored address) is an aggressor address, then the identified aggressor may be provided as a match address HitXADD. In some embodiments, the match address HitXADD may be provided responsive to the signal ArmSample. In some embodiments, the match address (e.g., aggressor address) HitXADD may be stored in a latch circuit for later retrieval by the refresh address generator 234 when the refresh address generator 234 determines a match address is needed.

In one example embodiment, in order to determine if the current address XADD is an aggressor address, the sampled value of the current row address XADD may be stored (e.g., latched in a latch circuit). The activation of ArmSample may also cause the aggressor detector circuit 232 to compare the currently sampled row address XADD to the previously stored addresses in the aggressor detector circuit 232. If the current row address XADD matches a stored address, the current row address XADD may be provided as the match address HitXA DD.

In another example embodiment, the aggressor detector circuit 232 may store the value of sampled addresses in a register, and may have a counter associated with each of the stored addresses. When ArmSample is activated, if the current row address XADD matches one of the stored addresses, the value of the counter may be incremented. Responsive to the activation of ArmSample, the aggressor detector circuit 232 may provide the address associated with the highest value counter as the match address HitXADD. Other methods of identifying aggressor addresses may be used in other examples.

In embodiments where every row access command is monitored, the sample timing circuit 230 may be omitted. In these embodiments, the aggressor detector circuit 232 may perform the functions above responsive to the ACT/Pre signal rather than the ArmSample signal.

The RHR state control circuit 236 may receive the refresh signal AREF and provide the row hammer refresh signal RHR. The refresh signal AREF may be periodically generated and may be used to control the timing of refresh operations. The memory device may carry out a sequence of auto refresh operations in order to periodically refresh the rows of the memory device. The RHR signal may be generated in order to indicate that the device should refresh a particular targeted row (e.g., a victim row) instead of an address from the sequence of auto refresh addresses. The RHR state control circuit 236 may use internal logic to provide the RHR signal. In some embodiments, the RHR state control circuit 236 may provide the RHR signal based on certain number of activations of AREF (e.g., every 4th activation of AREF, every 1st or 2nd pump of a double pump refresh operation). The RHR state control circuit 236 may also provide an internal refresh signal IREF, which may indicate that an auto refresh operation should take place. In some embodiments, the signals RHR and IREF may be generated such that they are not active at the same time (e.g., are not both at a high logic level at the same time).

In some embodiments, the refresh control circuit 216 may perform multiple refresh operations responsive to an activation of the refresh signal AREF. For example, each time the refresh signal AREF is received, the refresh control circuit 216 may perform M different refresh operations, by providing M different refresh addresses RXADD. Each refresh operation may be referred to as a 'pump'. In some embodiments, the refresh control circuit 216 may have a fixed pattern where some pumps are assigned to auto refresh operation and some pumps are assigned to targeted refresh operations. For example, in some embodiments, for a double pump refresh operations, the RHR state control circuit 236 may activate the row hammer refresh signal RHR for a first pump and activate the internal refresh signal IREF for the second pump. Thus, in some embodiments, RHR and/or IREF may be referred to as pump signals for a multi pump refresh operation. In some embodiments, the refresh control circuit 216 may dynamically determine whether a given pump is associated with an auto refresh operation, a targeted refresh operation, or no refresh operation.

The refresh address generator 234 may receive the row hammer refresh signal RHR, the internal refresh signal IREF, and the match address HitXADD. The match address HitXADD may represent an aggressor row. The refresh address generator 234 may determine the locations of one or more victim rows based on the match address HitXADD and provide the associated addresses (e.g., victim row addresses, targeted refresh addresses) as the refresh address RXADD when the signal RHR indicates a targeted refresh operation. In some embodiments, the victim rows may include rows which are physically adjacent to the aggressor row (e.g., HitXADD+1 and HitXADD-1). In some embodiments, the victim rows may also include rows which are physically adjacent to the physically adjacent rows of the aggressor row (e.g., HitXADD+2 and HitXADD-2). Alternative or additional relationships between victim rows and the identified aggressor rows may be used in other examples. For example, HitXADD+/−3, HitXADD+/−4, and/or other victim rows may also or may alternatively be refreshed.

In some embodiments, which victim rows are used to provided targeted refresh addresses (e.g., HitXADD+/−2, HitXADD+/−3, etc.) may be based on certain number of activations of RHR signal. For example, the refresh address generator 234 may provide victim row addresses corresponding to HitXADD+1 and HitXADD-1 every other time the RHR signal is activated and sequentially provide victim row addresses corresponding to more distant victim rows during the remaining RHR activations (e.g., HitXADD+/−2 after every other time HitXADD+/−1 is provided, HitXADD+/−3 after the every other time HitXADD+/−2 is provided, etc.). In some embodiments, which victim rows are refreshed may be based, at least in part, on a predetermined sequence programmed into the refresh address generator 234. In some embodiments, the sequence may be hard coded (e.g., fuses/antifuses) or may be configurable (e.g., a mode register write command or other write command) by one or more components, such as the DRAM interface 226. In some embodiments, which victim rows are refreshed may be based on signals and/or commands received from the DRAM interface 226 (not shown in FIG. 2) associated with the active AREF signal. The calculation of the targeted refresh addresses will be described in more detail with reference to following figures.

The refresh address generator 234 may determine the value of the refresh address RXADD based on the row hammer refresh signal RHR. In some embodiments, when the internal refresh signal IREF is active, the refresh address generator 234 may provide one of a sequence of auto refresh addresses. When the signal RHR is active, the refresh address generator 234 may provide a targeted refresh address, such as a victim address, as the refresh address RXADD. In some embodiments, the refresh address generator 234 may count activations of the signal RHR, and may provide closer victim rows (e.g., HitXADD+/−1) more frequently than victim rows which are further away from the aggressor address (e.g., HitXADD+/−2).

The row decoder 208 may perform one or more operations on the memory array (not shown) based on the received signals and addresses. For example, responsive to the activation signal ACT and the row address XADD (and IREF and RHR being at a low logic level), the row decoder 208 may direct one or more access operations (for example, a read operation) on the specified row address XADD. Responsive to the RHR signal being active, the row decoder 208 may refresh the refresh address RXADD.

Figure 3:
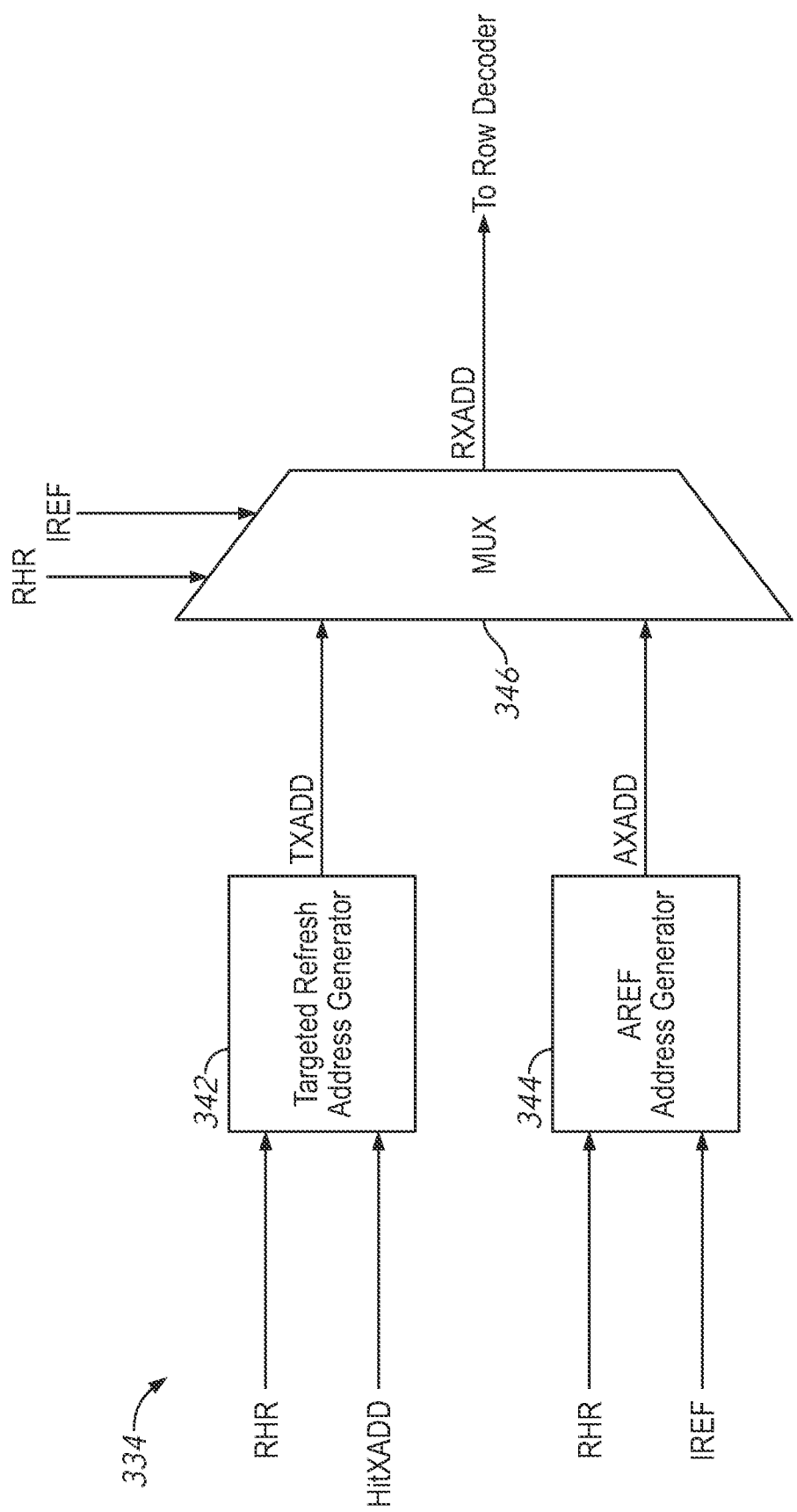
FIG. 3 is a block diagram of a refresh address generator according to an embodiment of the present disclosure.

FIG. 3 is a block diagram of a refresh address generator according to an embodiment of the present disclosure. In some embodiments, the refresh address generator 334 may be used to implement the refresh address generator 234. The refresh address generator 334 may include a targeted refresh address generator 342, an auto refresh (AREF) address generator 344, and a multiplexer (MUX) 346.

The targeted refresh address generator 342 receives the matched address HitXADD which may correspond to an aggressor row address and the row hammer refresh RHR signal. The matched address may be received from an aggressor detector circuit such as aggressor detector circuit 232 and the RHR signal may be received from an RHR state control circuit such as RHR state control circuit 236. Based at least in part on the matched address HitXADD, the targeted refresh address generator 342 may calculate one or more targeted refresh addresses TXADD, which may correspond to victim word lines of the aggressor word line associated with the matched address HitXADD.

The physical address of a row may not be equal to the logical address of the row in the memory device. Accordingly, as will be described in more detail with reference to the following figures, the targeted refresh address generator 342 may have to perform conversions between physical and logical addresses to determine the addresses of the victim rows of the aggressor row corresponding to the match address HitXADD. In some embodiments, known logical relationships between the physical and logical row addresses may be exploited to calculate victim row addresses for aggressor row addresses with logic circuits rather than going through a scramble conversion operation (e.g., lookup tables, latch-counter circuits, etc.).

The AREF address generator 344 generates an auto refresh address AXADD in response to the internal refresh signal IREF, which may be provided by a RHR state control circuit, such as RHR state control circuit 236. The auto refresh address AXADD may be part of a sequence of addresses to be refreshed as part of an auto refresh operation. The auto refresh address AXADD may correspond to multiple word lines in some embodiments. The refresh address generator 344 may update the current auto refresh address AXADD to a next address in the sequence in response to the active IREF signal. The AREF address generator 344 is also provided the row hammer refresh signal RHR from the state control circuit. When the RHR signal is active, the AREF address generator 344 may stop updating the auto refresh address AXADD. As described herein, since the active RHR signal indicates that a targeted refresh operation is to be conducted instead of an auto refresh operation, this allows the auto refresh operation to be suspended while the targeted refresh is carried out, and resumed when RHR signal is not active.

The MUX 346 accepts the targeted refresh addresses TXADD and the auto refresh addresses AXADD and outputs one of them as the refresh address RXADD to a row decoder (not shown), such as row decoder 208 and/or 108. The MUX 346 may receive the IREF and/or RHR signals to control the output of the MUX 346. In some embodiments, the MUX 346 may provide the targeted refresh address TXADD as RXADD when the RHR signal is in an active state and/or the IREF signal is in an inactive state. In some embodiments, the MUX 346 may provide the auto refresh address AXADD when the RHR signal is in an inactive state and/or the IREF signal is in an active state.

Figure 4:
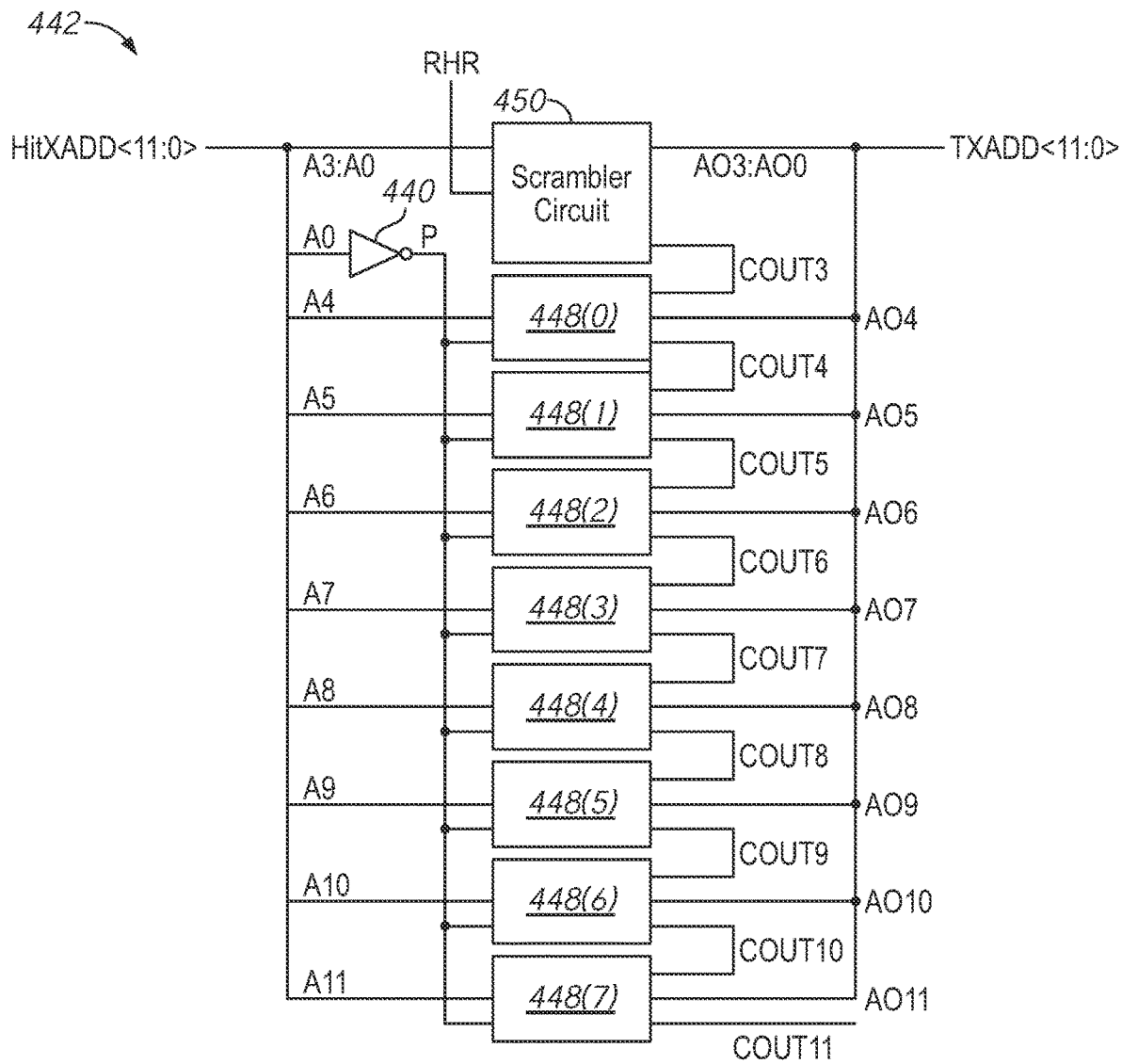
FIG. 4 is a block diagram showing a configuration of a targeted refresh address generator in accordance with an embodiment of the present disclosure.

FIG. 4 is a block diagram showing a configuration of a targeted refresh address generator in accordance with an embodiment of the present disclosure. The targeted refresh address generator 442 may be used to implement the targeted refresh address generator 342 in some embodiments. The targeted refresh address generator 442 receives the HitXADD address A11:A0 and provides a targeted refresh address TXADD address AO11:AO0. The targeted refresh address generator 442 may include a scrambler circuit 450 that provides the AO3:AO0 address bits and further include a series of row hammer count circuits 448(0)-448(7) that provide the AO11:AO4 address bits, respectively. The scrambler circuit 450 may receive a row hammer refresh signal RHR (e.g., from RHR state control circuit 236) and provide the AO3:AO0 bits and a carry bit COUT3 based on the A3:A0 address bits. Although the example shown depicts refresh addresses having 12-bits, in other embodiments, addresses including more or fewer bits may be used. Furthermore, in other embodiments, the scramble circuit 450 may receive a different number of least significant bits.

The row hammer count circuits 448(0)448(7) may each receive a respective address bit A11:A4; a carry out bit COUT from a preceding one of the row hammer count circuits 448(0)-448(7), with the row hammer count circuit 448(0) receiving the carry bit COUT3 from the scrambler circuit 450; and an inverted A0 bit (via the inverter 440) as a polarity bit P used to indicate addition or subtraction. Each of the row hammer count circuits 448(0)-448(7) may calculate a respective one of the AO11:AO4 signals based on the received input signals.

Figure 5:
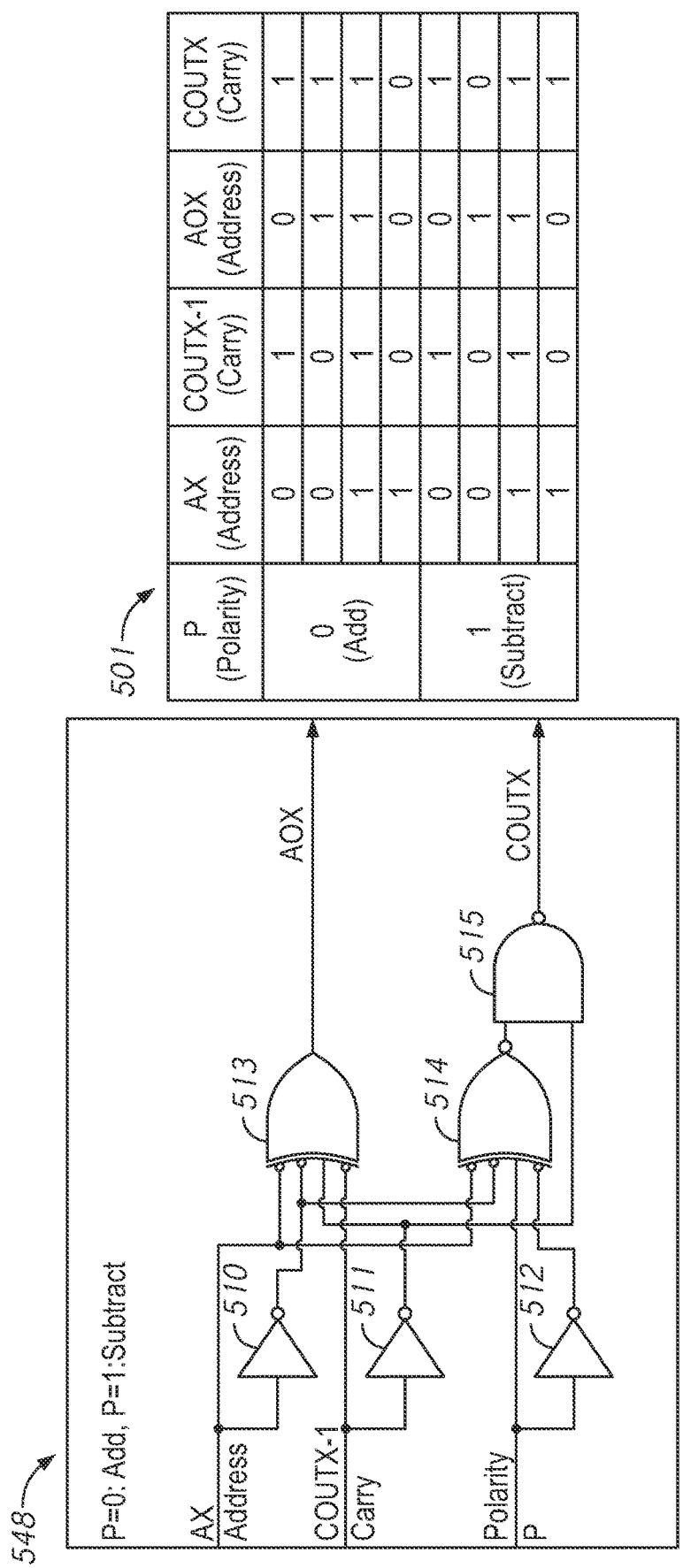
FIG. 5 is a circuit diagram of a configuration of a row hammer count circuit according to an embodiment of the present disclosure.

FIG. 5 is a circuit diagram of a configuration of a row hammer count circuit according to an embodiment of the present disclosure. The row hammer count circuit 548 may be used to implement one or more of the row hammer count circuits 448(0)-448(7). The row hammer count circuit 548 may be used to calculate an address output bit AOX based on an address bit AX (where X is an integer from 4 to 11), a carry out bit COUTX-1 from a previous row hammer counter circuit or scrambler circuit (e.g., scrambler circuit 450), and a polarity bit P. The row hammer count circuit 548 includes an XOR logic gate 513 configured to receive the address bit AX and the carry out COUTX-1 bit (and inverted AX bit via inverter 510 and inverted COUTX-1 bit via inverter 511) to provide the address output bit AOX using XOR logic. The row hammer count circuit 548 further includes an XOR logic gate 514 configured to receive the polarity bit and the carry out COUTX-1 bit (and inverted polarity bit via inverter 512 and inverted COUTX-1 bit via inverter 511) to provide an input to a NAND logic gate 515 using XOR logic. The NAND logic gate 515 may use NAND logic on the output of the XOR logic gate 514 and the inverted COUTX-1 bit to provide the COUTX bit. The table 501 depicts logical combinations of the AX, COUTX-1, and polarity bits, and resultant AOX and COUTX bits.

Turning back to FIG. 4, the output address bits AO11: AO0 may be provided to downstream circuitry as the targeted refresh address TXADD for targeted refresh operations, which may mitigate effects from a row hammer attack. The logic circuits depicted in FIGS. 4 and 5 are exemplary and other logic circuits could be implemented without departing from the scope of the disclosure.

Figure 6:
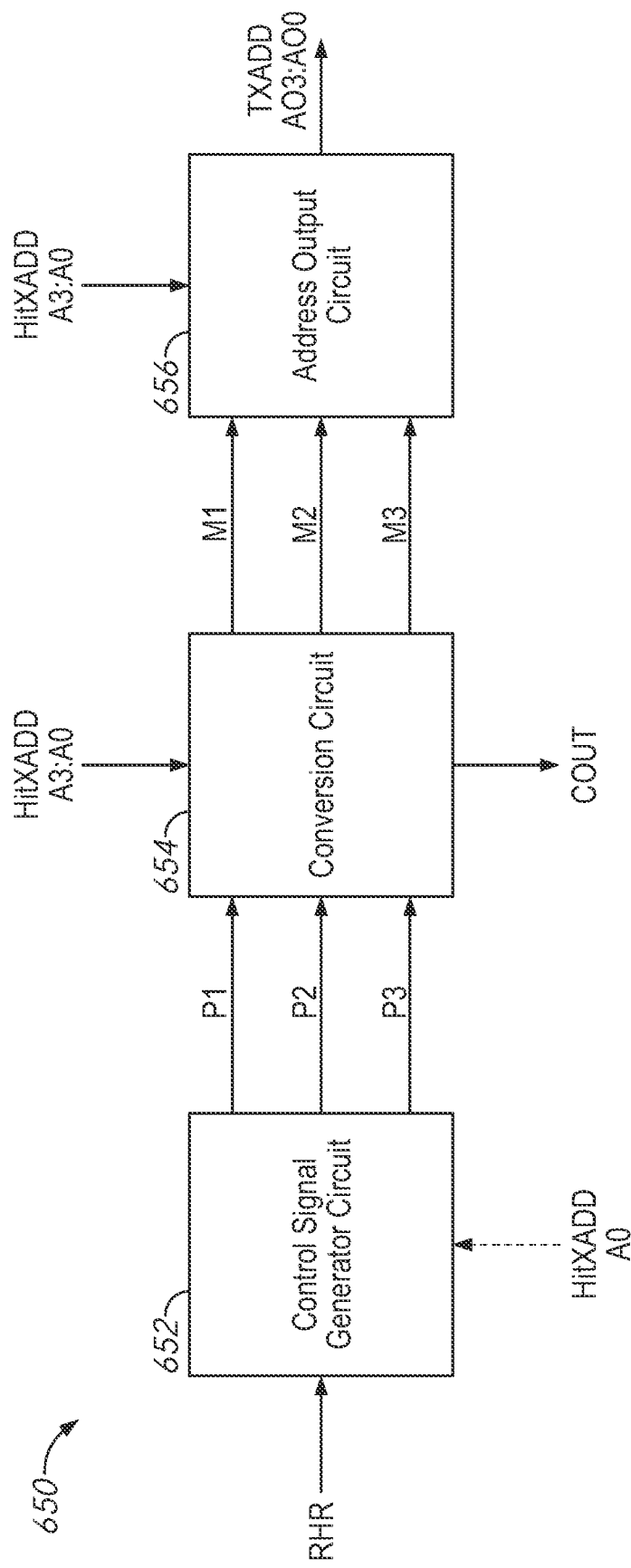
FIG. 6 is a block diagram of a scrambler circuit according to an embodiment of the present disclosure.

FIG. 6 is a block diagram of a scrambler circuit according to an embodiment of the present disclosure. In some embodiments, the scrambler circuit 650 may be used to implement scrambler circuit 450. The scrambler circuit 650 may include a control signal generator circuit 652, a conversion circuit 654, and an address output circuit 656. The scrambler circuit 650 may be used to provide the least significant bits (e.g., 4 bits in the example shown) of a targeted refresh address TXADD, which may be a row address associated with a victim row of an aggressor row (e.g., an aggressor row determined by the aggressor detector circuit 232). The control signal generator circuit 652 may provide control signals to indicate a spatial relationship between an aggressor row and victim rows for which targeted refresh addresses should be calculated. Based at least in part on the spatial relationship indicated by the control signals, the conversion circuit 654 may provide flip signals to indicate how to convert the aggressor row address into one or more targeted refresh addresses. The address output circuit 656 may flip one or more bits of the aggressor row address based on the flip signals and output the targeted refresh address.

The control signal generator circuit 652 may receive a row hammer refresh signal RHR, which may be provided by an RHR state control circuit, such as RHR state control circuit 236. The control signal generator circuit 652 may provide various control signals P1-P3. The logic states of the control signals P1-P3 may be based, at least in part, on the RHR signal. The control signals P1-P3 may indicate a physical relationship of one or more victim rows of an aggressor row for which targeted refresh addresses (e.g., victim row addresses) are to be calculated. For example, different combinations of logic states of control signals P1-3 may correspond to different physical relationships (e.g., HitXADD+/−1, HitXADD+/−2, HitXADD+/−3 . . . HitXADD+/−8).

In some embodiments, the control signal generator circuit 652 may include internal logic to determine which spatial relationship to indicate via the control signals P1-P3. For example, a counter circuit may count activations of the RHR signal and the control signals P1-P3 may be repeatedly incremented through all possible combinations as the count of the counter circuit changes. In another example, additional counters and/or other logic may be used such that some spatial relationships are indicated by control signals P1-P3 more frequently than other spatial relationships. For example, targeted refresh addresses corresponding to HitXADD+/−1 may be calculated more frequently than HitXADD+/−2, which may in turn be calculated more frequently than HitXADD+/−3. These examples are merely provided for illustration and the disclosure is not limited to these examples. Alternatively, the states of P1-P3 may be set based, at least in part, by signals provided by another component (not shown), for example, a command decoder, such as command decoder 106.

In some embodiments, the states of P1-P3 may indicate whether to calculate a first targeted refresh address or a second targeted refresh address. For example, the states of P1-P3 may indicate whether HitXADD+4 or HitXADD−4 should be calculated. In some embodiments, the control signal generator circuit 652 may further receive the least significant bit A0 of the match address HitXADD. The states of the P1-P3 signals may be further based, at least in part, on the state of A0. In some embodiments, when A0=0 (e.g., HitXADD is an even address), P1-P3 may indicate that HitXADD+Y is calculated first and HitXADD-Y is calculated second (where Y is a natural number). That is, the +Y address is the first address and the −Y is the second address. When A0=1 (e.g., HitXADD is an odd address), P1-P3 may indicate that HitXADD-Y is calculated first and HitXADD+Y is calculated second. Similarly, the −Y is the first address and +Y is the second address.

The conversion circuit 654 may receive the three least significant bits A3:A0 of a match address HitXADD. The bits A3:A0 may be received from an aggressor row detector circuit, such as aggressor row detector circuit 236. The conversion circuit 654 may receive the control signals P1-P3. Based at least in part on the control signals P1-P3 and bits A3:A0, the conversion circuit 654 may provide a carry bit COUT and flip signals M1-M3. The carry bit COUT may be provided to one or more row hammer counter circuits, such as row hammer counter circuit 548 and/or row hammer counter circuits 448(0)-(7) to calculate the higher order bits of the targeted refresh address as described with reference to FIGS. 4-5. The carry bit COUT may account for special cases, for example, at A3:A0=0000, the HitXADD−1 cannot be further reduced by one without involving a next higher order bit (e.g., A4).

The flip signals M1-M3 may indicate whether or not a bit of the match address HitXADD should be flipped (e.g., changed from '1' to '0' or '0' to '1') to generate a victim row address for a victim row address having the physical relationship to the aggressor row indicated by the control signals P1-P3.

In some embodiments, the flip signals M1-M3 may only correspond to bits A1:A3, respectively. In some embodiments, a flip signal for the least significant bit A0 may not be necessary as row addresses for two victim rows having the same spatial relationship to the aggressor row (e.g., victim rows on either side of an aggressor row) may be known based on the spatial relationship. For victim rows having an odd number relationship to the aggressor row (e.g., +/−1, +/−3), A0 may be inverted for the victim row address. For victim rows having an even number relationship (e.g., +/−2, +/−4), A0 may not be inverted.

The address output circuit 656 may receive the flip signals M1-M3 and the match address HitXADD. Based at least in part, on the flip signals, M1-M3, the address output circuit 656 may flip one or more bits A3:A1 of the match address HitXADD to generate the targeted refresh address TXADD (e.g., convert HitXADD to TXADD). In some embodiments, the address output circuit 656 may flip the bits A3:A1 by XOR'ing individual ones of the bits with the corresponding flip signal M1-3. However, in other embodiments, other logic may be used to flip the appropriate bits A3:A1 based on the flip signals M1-M3. The targeted refresh address TXADD may correspond to one or more victim rows having a same spatial relationship to an aggressor row corresponding to the match address HitXADD. The spatial relationship may be the spatial relationship indicated by the control signals P1-P3.

In some embodiments, the same circuitry may be used to generate the targeted refresh address TXADD, regardless of the match address HitXADD and the spatial relationship of the victim rows corresponding to TXADD. In some embodiments, this may reduce circuit layout requirements where separate circuits are used to calculate victim row addresses associated with victim rows having different spatial relationships to the aggressor row associated with match address HitXADD.

Figure 7:
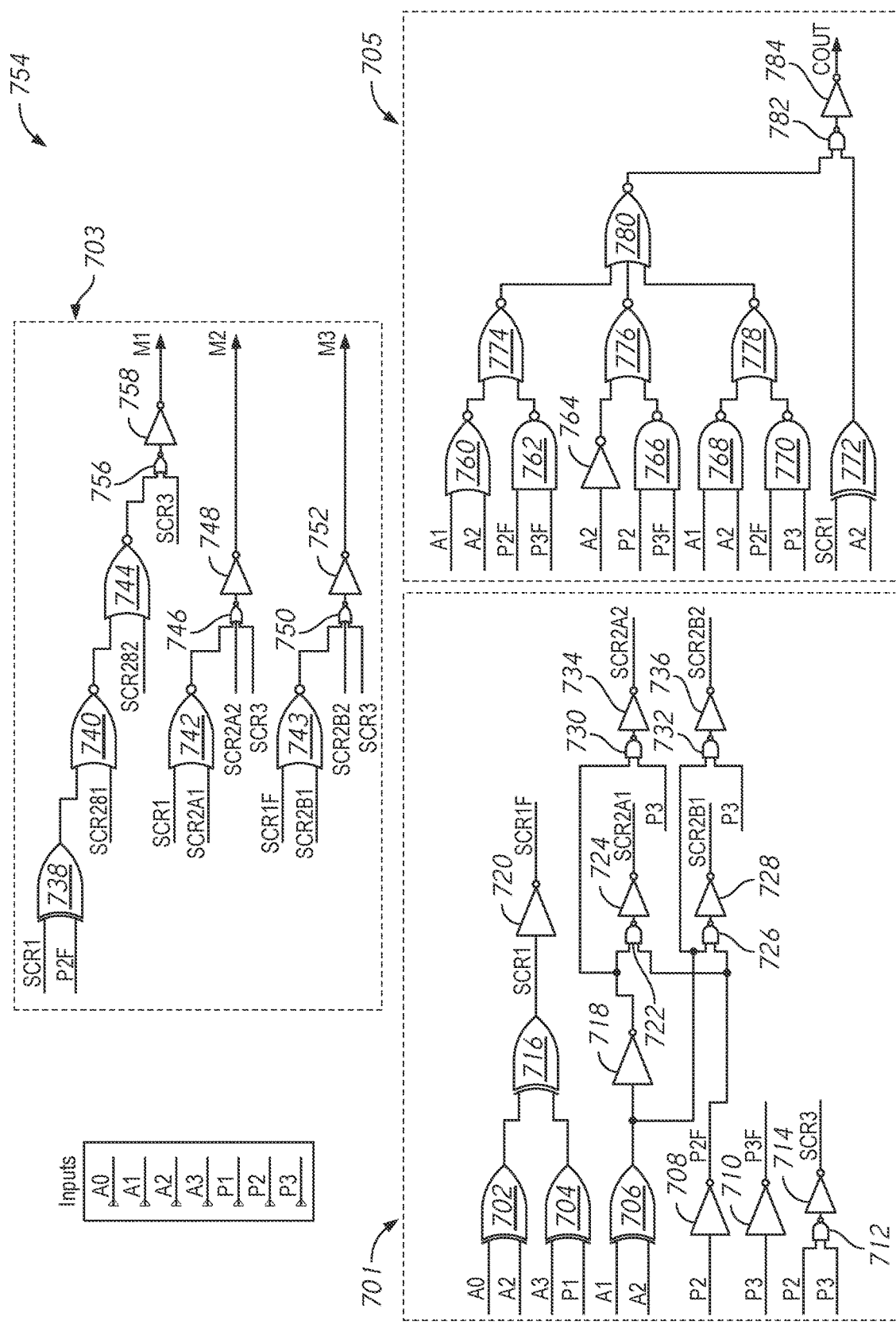
FIG. 7 is a circuit diagram for a conversion circuit according to an embodiment of the present disclosure.

FIG. 7 is a circuit diagram for a conversion circuit according to an embodiment of the present disclosure. In some embodiments, conversion circuit 754 may be used to implement conversion circuit 654. The logic circuits depicted in FIG. 7 are exemplary and other logic circuits could be implemented without departing from the scope of the disclosure. The conversion circuit 754 may be used to generate signals for generating targeted refresh addresses corresponding to victim rows having varying spatial relationships to an aggressor row. In some applications, the conversion circuit 754 may make scramble conversions using latch circuits and/or conversion table look-ups unnecessary. This may save layout area and/or reduce computation time of the targeted refresh addresses in some applications.

The conversion circuit 754 may receive the least significant bits of a match address HitXADD, bits A0:A3 in the example shown in FIG. 7. The match address HitXADD may be received from an aggressor row detector circuit, such as aggressor row detector circuit 232, and correspond to an aggressor row. Although four bits are received in the example shown, more or fewer least significant bits may be received in other examples.

The control conversion circuit 754 may receive one or more control signals, control signals P1-P3 in the example shown in FIG. 7. The control signals may be received from a control signal generator circuit, such as control signal generator circuit 652. The control signals P1-P3 may indicate victim rows for which row addresses should be generated (e.g., targeted refresh addresses). The victim rows may be indicated based on their spatial relationship to the aggressor row such as +/−1, +/−2, +/−3, +/−4, +/−5, +/−6, +/−7, and/or +/−8, where +/−1 indicates victim rows directly adjacent to the aggressor row and +/−8 indicates victim rows where there are seven other rows physically located between the victim rows and the aggressor rows. While three control signals and eight spatial relationships may be indicated by the control signals in the example shown in FIG. 7, in other examples, more or fewer control signals and/or spatial relationships may be indicated in other examples.

The control signals P1-P3 may further indicate whether the +Y or the −Y victim row address should be calculated. In the example shown in FIG. 7, Y is an integer between 1 and 8. In some embodiments, the control signals P1-P3 may change with one or more pumps of a refresh operation, for example, for pumps associated with targeted refresh operations. Thus, P1-P3 may indicate +Y should be calculated responsive to a pump and −Y should be calculated responsive to another pump. In some embodiments, when bit A0 is '0' (e.g., HitXADD is an even address), +Y may be calculated first and when bit A1 is '1' (e.g., HitXADD is an odd address), −Y may be calculated first. In addition to +Y or −Y, P1-P3 may also change the value of Y between pumps in some embodiments. In some embodiments, signals other than pumps may trigger changes in P1-P3 during a refresh operation.

The conversion circuit 754 may provide flip signals which indicate whether or not a bit of the HitXADD address should be flipped (e.g., changed from '1' to '0' or vice versa) to generate the victim row address indicated by the control signals. In the example shown in FIG. 7, three flip signals M1-M3 are provided, which may correspond to bits A1:A3 in some embodiments. However, in other examples, more or fewer flip signals may be provided. In some embodiments, the least significant bit A0 may not require a flip signal to generate the targeted refresh address, as whether or not to flip A0 is known based on the spatial relationship as discussed previously. The flip signals may be provided to an address output circuit, such as address output circuit 656, which may flip the bits A1:A3 of HitXADD as indicated by the flip signals M1-M3 (e.g., by XOR'ing the bits and the flip signals) to generate the least significant bits of a targeted refresh address.

The conversion circuit 754 may provide a carry bit COUT, which may indicate whether a higher order bit is required to generate the target refresh address for the victim row. The carry bit may be provided to one or more row hammer counters, for example, row hammer counter circuits 448(0)-448(7) and/or 548. The carry bit COUT may be used to generate the most significant bits of the targeted refresh address as described with reference to FIGS. 4 and 5.

A portion 701 of conversion circuit 754 may receive the address bits A0-A3 and control signals P1-P3 and provide various intermediate signals to other portions of conversion circuit 754. XOR circuit 702 may receive bits A0 and A2 and XOR circuit 704 may receive bit A3 and control signal P1. The outputs of XOR circuit 702 and XOR circuit 704 may be provided to XOR circuit 716 which may generate signal SCR1. Inverter circuit 720 may receive SCR1 and provide signalSCR1F.

XOR circuit 706 may receive bit A1 and bit A2. The output of XOR circuit 706 may be provided to inverter circuit 718. Inverter circuit 708 may receive control signal P2 and provide signal P2F. NAND circuit 722 may receive the output of inverter circuit 718 and the signal P2F. The output of NAND circuit 722 may be received by inverter circuit 724 which may provide signal SCR2A1. NAND circuit 730 may also receive the output of inverter circuit 718 and control signal P3. The output of NAND circuit 730 may be provided to inverter circuit 734 which may provide signal SCR2A2.

NAND circuit 726 may receive the output of XOR circuit 706 and the signal P2F. The output of NAND circuit 726 may be provided to inverter circuit 728 which may provide signal SCR2B1. NAND circuit 732 may receive the output of XOR circuit 706 and control signal P3. The output of NAND circuit 732 may be provided to inverter circuit 736 which may provide signal SCR2B2.

Inverter circuit 710 may receive control signal P3 and output signal P3F. NAND circuit 712 may receive control signals P2 and P3. The output of NAND circuit 712 may be provided to inverter circuit 714 which may provide signal SCR3.

The intermediate signals SCR1, SCR1F, SCR2A1, SCR2A2, SCR2B1, SCR2B2, SCR3, P2F, and P3F generated by portion 701 may be used by other portions of the conversion circuit 754 to generate flip signals M1-M3 and carry bit COUT.

A portion 703 of conversion circuit 754 may receive intermediate signals from portion 701 to generate the flip signals M1-M3. In some embodiments, flip signal M1 may indicate whether bit A1 of HitXADD should be flipped, flip signal M2 may indicate whether bit A2 should be flipped, and flip signal M3 may indicate whether bit A3 should be flipped. In some examples, when M1-M3 is logic high ('1'), it indicates the corresponding bit A1-A3 should be flipped and when M1-M3 is logic low ('0'), it indicates the corresponding bit A1-A3 should not be flipped (e.g., remain the same).

XOR circuit 738 may receive signals SCR1 and P2F and NOR circuit 740 may receive the output of XOR circuit 738 and signal SCR2B1. NOR circuit 744 may receive the output of NOR circuit 740 and signal SCR2B2. NOR circuit 756 may receive the output of NOR circuit 744 and signal SCR3. The output of NOR circuit 756 may be provided to inverter circuit 758, which may provide flip signal M1.

NOR circuit 742 may receive signals SCR1 and SCR2A1. NOR circuit 746 may receive the output of NOR circuit 742 and signals SCR2A2 and SCR3. The output of NOR circuit 746 may be provided to inverter circuit 748, which may provide flip signal M2.

NOR circuit 743 may receive signals SCR1F and SCR2B1. NOR circuit 750 may receive the output of NOR circuit 743 and signals SCR2B2 and SCR3. The output of NOR circuit 743 may be provided to inverter 752, which may provide flip signal M3.

In some embodiments, the flip signals M1-M3 generated by the portion 703 may be provided to an address output circuit, such as address output circuit 656.

A portion 705 of the conversion circuit 754 may receive address bits A1 and A2 and control signals P2 and P3, and intermediate signals from portion 701 to generate the carry bit COUT. NOR circuit 760 may receive bits A1 and A2 and NAND circuit 762 may receive signals P2F and P3F. The outputs of NOR circuit 760 and NAND circuit 762 may be provided to NOR circuit 774. Inverter circuit 764 may receive bit A2 and NAND circuit 766 may receive control signal P2 and signal P3F. The output of inverter circuit 764 and NAND circuit 766 may be provided to NOR circuit 776. NAND circuit 768 may receive bit A1 and bit A2 and NAND circuit 770 may receive signal P2F and control signal P3. The outputs of NAND circuit 768 and NAND circuit 770 may be received by NOR circuit 778.

NOR circuit 780 may receive the outputs of NOR circuit 774, NOR circuit 776, and NOR circuit 778. XOR circuit 772 may receive signal SCR1 and bit A2. NAND circuit 782 may receive the outputs of NOR circuit 780 and XOR circuit 772. The output of NAND circuit 782 may be provided to inverter circuit 784 which may provide the carry bit COUT. The carry bit COUT may be provided to one or more row hammer counter circuits (e.g., row hammer counter circuits 448(0)448(7) and/or 548) for generating more significant bits of the targeted refresh address in some embodiments.

Figure 8:
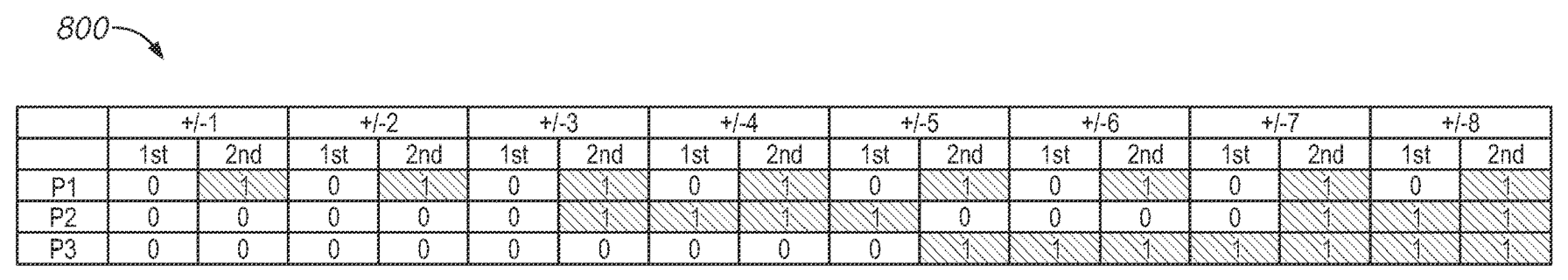

FIG. 8 is a table illustrating logic states of control signals for indicating a spatial relationship between an aggressor row and victim rows according to an embodiment of the present disclosure. In some embodiments, the states of P1-P3 indicated in table 800 may be used to cause a conversion circuit, such as conversion circuit 754, to provide signals indicating which bits, if any, of an aggressor row address should be flipped to generate a targeted refresh address corresponding to victim row having an indicated spatial relationship to the aggressor row.

The top row of table 800 indicates the spatial relationship of the victim rows to the aggressor row (e.g., +/−1, +/−2, +/−3, and so on). The second row of table 800 indicates the first victim row address or the second victim row address calculated. As noted, in some embodiments, if the aggressor row address is even, the +Y address is calculated first and the −Y address is calculated second, and if the aggressor row address is odd, the −Y address is calculated first and the +Y address is calculated second. Thus, the "$1^{st}$" and "$2^{nd}$" columns of table 800 do not necessarily always correspond to +Y or −Y or vice versa. The final three rows of table 800 indicate the logic states of the control signals P1-P3 to be provided to the conversion circuit to cause the conversion circuit to generate the targeted refresh address for the different spatial relationships.

It is noted that the states of P1-P3 for +/−1 and +/−2 are the same, as are the states of P1-P3 for +/−3 for the first calculated address. Similarly, the states of P1-3 for the second addresses calculated for +/−3 and +/−4 are the same and the first address calculated for +/−4 and +/−5 are the same. Other redundancies in the states of P1-P3 (e.g., same logic state combinations) for different address calculations for other spatial relationships are also shown in table 800. These redundancies are due to the fact that as noted previously, P1-P3 may only cause flip signals to be generated corresponding to bits A1:A3 (e.g., flip signals M1-M3), but no flip signals to be generated for A0. Accordingly, for these pairs of spatial relationships, the only difference in the conversion for the two spatial relationships is the least significant bit A0 and/or higher order bits (e.g., A4:A11).

Figure 9:
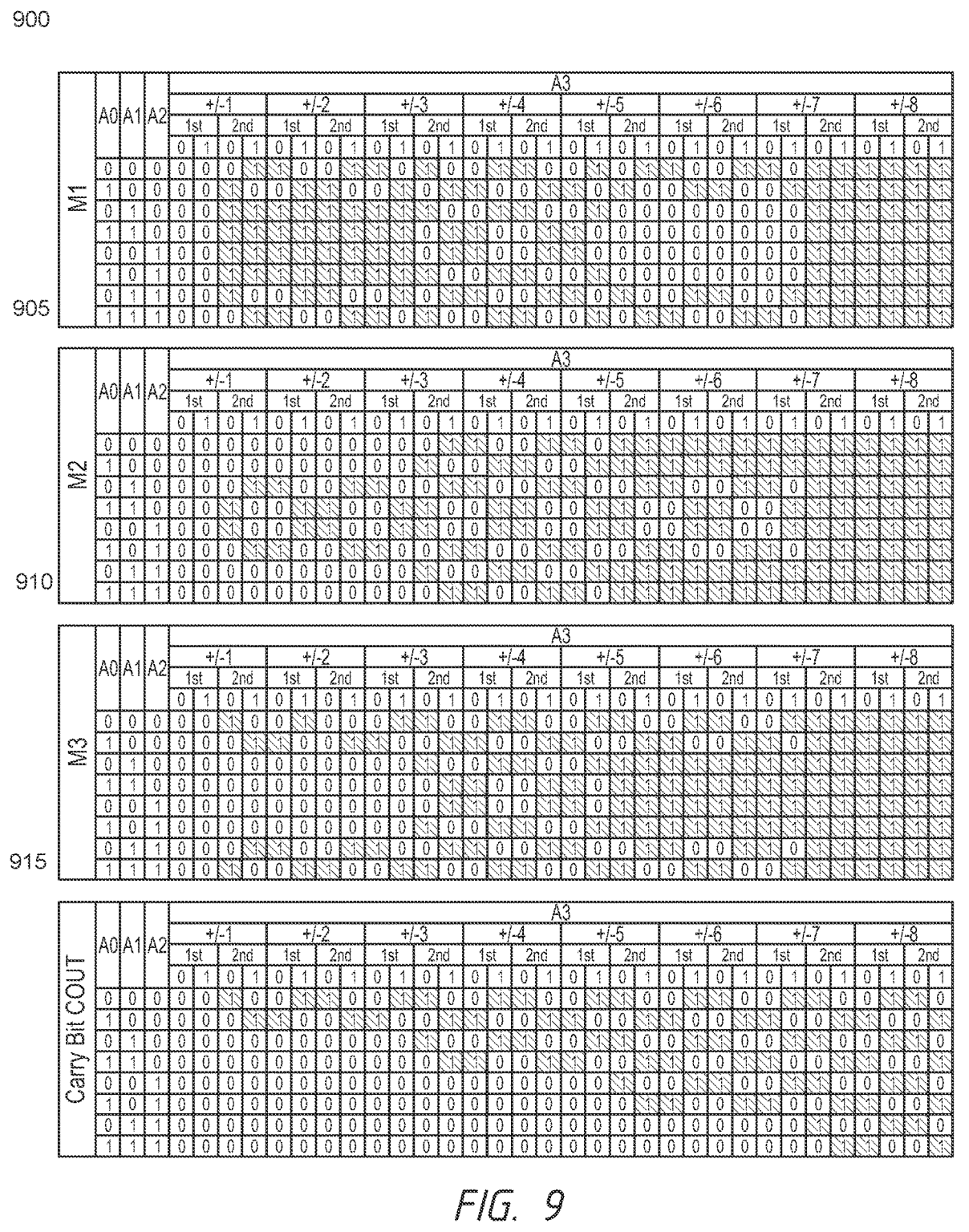

FIG. 9 are tables illustrating logic states of flip and carry signals for generating targeted refresh addresses from match addresses according to an embodiment of the present disclosure. The tables 900, 905, and 910 may indicate the logic states of flip signals M1, M2, M3, respectively, to indicate whether the least significant bits of an aggressor row address should be flipped to generate a targeted refresh address of a victim row having a certain spatial relationship to an aggressor row associated with the aggressor row address. The flip signals M1-M3 may be provided by a conversion circuit, such as conversion circuit 754, in some embodiments. The flip signals M1-M3 may be provided to an address output circuit, such as address output circuit 656, which may flip bits of the aggressor row address as indicated by the flip signals M1-M3 to generate the least significant bits of the targeted refresh address.

The table 915 may indicate the logic states of a carry bit COUT which may be used to generate higher order bits of the targeted refresh address. The carry bit may be provided by the conversion circuit, such as conversion circuit 754, in some embodiments.

The top rows of the tables 900, 905, 910, and 915 indicate the address bits of the aggressor row address (e.g., match address HitXADD), A3:A0 in the example shown in FIG. 9. The bits A3:A0 may be the least significant bits of the aggressor row address in some embodiments. The second row indicates the spatial relationship of a victim row corresponding to the targeted refresh address to an aggressor row corresponding to the aggressor row address, as explained previously with reference to table 800. The third row indicates whether the bits correspond to the first or the second targeted refresh address calculated, as also explained above with reference to table 800. The first row of bits under the $1^{st}\ 2^{nd}$ row (the fourth row), indicates the state of A3, as noted by the label in the top row. The remaining rows indicate the state of the flip signals M1-M3 (for tables 900, 905, and 910) or carry bit COUT (for table 915).

As may be inferred from the states of flip signals M1-M3 shown in tables 900, 905, and 910, certain logical relationships between the physical and logical addresses of word lines may be exploited such that the same circuitry may be used to generate victim row addresses for victim rows having a range of physical relationships to an aggressor row (e.g., +/−1 to +/−8 in the example shown). For example, as indicated by flip signals M1-M3 for the second targeted refresh address for +/−7 and for both targeted refresh addresses, all bits A1:A3 are flipped, and for the first address of +/−1, none of bits A1:A3 are flipped. In another example, for certain spatial relationships and/or first or second addresses, flip signals M1 and M3 are inverses of one another. In a further example, for certain spatial relationships and/or first or second addresses, flip signals M1 and M3 are inverses of M2. Additionally, various symmetries and/or inverses of the flip signals M1-M3 to themselves across spatial relationships and/or first and second addresses can be observed, which may also be used to provide circuitry for generating targeted refresh addresses. Thus, while the conversion circuit shown in FIG. 7 is one implementation, other circuits may be used to implement the conversion circuit by using the various relationships between row addresses shown in tables 900, 905, and/or 910.

The apparatuses and methods disclosed herein may calculate victim row addresses having a variety of spatial relationships to an aggressor row based on one or more control signals. In some embodiments, the same circuitry may be used to calculate the different victim row addresses by changing the states of the control signals. The apparatuses and methods disclosed herein may reduce or eliminate the need for descrambling circuits with latches and/or other complex circuitry that may require more layout area. The apparatuses and methods disclosed herein may reduce or eliminate the need for lookup tables and/or other descrambling operations that may require more computation time.

Of course, it is to be appreciated that any one of the examples, embodiments or processes described herein may be combined with one or more other examples, embodiments and/or processes or be separated and/or performed amongst separate devices or device portions in accordance with the present systems, devices and methods.

Finally, the above-discussion is intended to be merely illustrative of the present system and should not be construed as limiting the appended claims to any particular embodiment or group of embodiments. Thus, while the present system has been described in particular detail with reference to exemplary embodiments, it should also be appreciated that numerous modifications and alternative embodiments may be devised by those having ordinary skill in the art without departing from the broader and intended spirit and scope of the present system as set forth in the claims that follow. Accordingly, the specification and drawings are to be regarded in an illustrative manner and are not intended to limit the scope of the appended claims.

What is claimed is:

1. An apparatus comprising:
   a scrambler circuit configured to:
     provide a plurality of least significant bits of a victim row address corresponding to a victim row having a spatial relationship to an aggressor row, the spatial relationship indicated by a control signal, wherein circuitry is used to generate all of the plurality of least significant bits of the victim row address regardless of the spatial relationship indicated by the control signal; and
     provide a carry bit based, at least in part, on the control signal; and
   a plurality of row hammer count circuits configured to provide a corresponding plurality of most significant bits of the victim row address based, at least in part, on the carry bit.

2. The apparatus of claim 1, wherein the plurality of least significant bits of the victim row address are generated by flipping one or more bits of a plurality of least significant bits of an aggressor row address corresponding to the aggressor row.

3. The apparatus of claim 1, wherein the plurality of row hammer count circuits each receive a least significant bit of an aggressor row address corresponding to the aggressor row and further receive a corresponding one of a plurality of most significant bits of the aggressor row address, the plurality of most significant bits of the victim row address are based on the least significant bit of the aggressor row address and the corresponding ones of the plurality of most significant bits of the aggressor row address.

4. The apparatus of claim 1, further comprising a refresh address generator including the scrambler circuit, wherein the refresh address generator is configured to provide the victim row address as a refresh address during a targeted refresh operation and provide an auto refresh address during an auto refresh operation.

5. The apparatus of claim 1, wherein the scrambler circuit comprises:
   a control signal generator circuit configured to provide the control signal;
   a conversion circuit configured to provide the carry bit; and
   an address output circuit configured to provide the plurality of least significant bits of the victim row address.

6. The apparatus of claim 1, wherein each of the plurality of row hammer count circuits comprises an XOR circuit.

7. The apparatus of claim 1, wherein the scrambler circuit comprises a plurality of logic circuits.

8. A method comprising:

receiving a control signal indicating a spatial relationship between a victim row and an aggressor row;

generating a plurality of least significant bits of a victim row address corresponding to the victim row having the spatial relationship to the aggressor row, regardless of the spatial relationship indicated by the control signal; and generate a carry bit based, at least in part, on the control signal.

9. The method of claim 8, further comprising generating a plurality of most significant bits of the victim row address based, at least in part, on the carry bit.

10. The method of claim 9, further comprising:

receiving a least significant bit of an aggressor row address corresponding to the aggressor row; and receiving a plurality of most significant bits of the aggressor row address, the plurality of most significant bits of the victim row address based on the least significant bit of the aggressor row address and the plurality of most significant bits of the aggressor row address, wherein the plurality of most significant bits of the victim row address are further based on the least significant bit and the plurality of most significant bits of the aggressor row address.

11. The method of claim 8, wherein generating the plurality of least significant bits of the victim row address comprises flipping one or more bits of a plurality of least significant bits of an aggressor row address corresponding to the aggressor row.

12. The method of claim 8, further comprising:

providing the victim row address during a targeted refresh operation; and providing an auto refresh address during an auto refresh operation.

13. The method of claim 12, further comprising:
performing the targeted refresh operation; and
performing the auto refresh operation.

14. The method of claim 8, further comprising receiving a row hammer refresh signal, wherein the control signal is based, at least in part, on the row hammer refresh signal.

15. The method of claim 14, further comprising receiving a least significant bit of an aggressor row address corresponding to the aggressor row, wherein the control signal is further based on the least significant bit of the aggressor row address.

16. The method of claim 8, wherein the control signal comprises three signals.

17. An apparatus comprising:
a refresh address generator comprising:
a scrambler circuit configured to:
generate a control signal;
provide a plurality of least significant bits of a victim row address corresponding to a victim row having a spatial relationship to an aggressor row, the spatial relationship indicated by the control signal; and
provide a carry bit based, at least in part, on the control signal;
a plurality of row hammer count circuits configured to provide a corresponding plurality of most significant bits of the victim row address based, at least in part, on the carry bit; and
an auto refresh address generator configured to generate an auto refresh address.

18. The apparatus of claim 17, wherein the plurality of least significant bits of the victim row address regardless of the spatial relationship indicated by the control signal.

19. The apparatus of claim 17, wherein the refresh address generator further comprises a multiplexer to select between the victim row address and the auto refresh address.

20. The apparatus of claim 17, further comprising an aggressor detector circuit configured to provide an aggressor row address corresponding to the aggressor row to the refresh address generator.

* * * * *